United States Patent
Yu et al.

(10) Patent No.: US 7,408,219 B2
(45) Date of Patent: Aug. 5, 2008

(54) NONVOLATILE SEMICONDUCTOR MEMORY DEVICE

(75) Inventors: Tea-kwang Yu, Suwon-si (KR);
Weon-ho Park, Suwon-si (KR);
Kyoung-hwan Kim, Hwaseong-si (KR);
Kwang-tae Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 351 days.

(21) Appl. No.: 11/099,658

(22) Filed: Apr. 6, 2005

(65) Prior Publication Data

US 2006/0006453 A1    Jan. 12, 2006

(30) Foreign Application Priority Data

Jul. 12, 2004    (KR) .................. 10-2004-0054077

(51) Int. Cl.
*H01L 29/788* (2006.01)

(52) U.S. Cl. ................ 257/315; 257/321; 257/E29.129

(58) Field of Classification Search ......... 257/315–316, 257/318, 321–322, 326, E29.129
See application file for complete search history.

(56) References Cited

U.S. PATENT DOCUMENTS 5,273,923 A * 12/1993 Chang et al. ............... 438/264

| | | | |
|---|---|---|---|
| 6,190,973 B1 | 2/2001 | Berg et al. | ............. 438/275 |
| 6,376,875 B1 | 4/2002 | Kakoschke et al. | |
| 6,534,364 B1 | 3/2003 | Erdeljac et al. | |

FOREIGN PATENT DOCUMENTS

| JP | 10-056090 | 2/1998 |
|---|---|---|
| KR | 1999-0055792 | 7/1999 |

* cited by examiner

*Primary Examiner*—Hoai v Pham
(74) *Attorney, Agent, or Firm*—Lee & Morse, P.C.

(57) ABSTRACT

In a nonvolatile semiconductor memory device, and a method of fabricating the same, the nonvolatile semiconductor memory device includes a cell doping region and source/drain regions in a semiconductor substrate, the cell doping region being doped as a first conductive type, a channel region disposed between the source/drain regions in the semiconductor substrate, a tunnel doping region of the first conductive type formed in a predetermined region of an upper portion of the cell doping region, the tunnel doping region being doped in a higher concentration than that of the cell doping region, a tunnel insulating layer formed on a surface of the semiconductor substrate on the tunnel doping region, a gate insulating layer surrounding the tunnel insulating layer and covering the channel region and the cell doping region exposed beyond the tunnel doping region, and a gate electrode covering the tunnel insulating layer and on the gate insulating layer.

10 Claims, 4 Drawing Sheets

NONVOLATILE SEMICONDUCTOR MEMORY DEVICE

BACKGROUND OF THE INVENTION

1. Field of the Invention

The present invention relates to a nonvolatile semiconductor memory device and a method of fabricating the same. More particularly, the present invention relates to a nonvolatile semiconductor memory device and a method of fabricating the same that can improve electrical characteristics and a degree of integration of a floating gate tunneling oxide (FLOTOX) type and an electrically erasable programmable read only memory (EEPROM) type semiconductor memory device.

2. Description of the Related Art

In general, an electrically erasable programmable read only memory (EEPROM) cell includes a floating gate that is electrically insulated with a periphery like in an erasable programmable read only memory (EPROM). An EEPROM records data of "1" or "0" by injecting or discharging electrons into/from the floating gate. However, the EEPROM utilizes an electron injecting/discharging mechanism that is very different from that of the EPROM.

In the EPROM, the injection of electrons into the floating gate is performed by a hot electron having a higher energy than the electrons flowing between a source and a drain, and the discharge of electrons is performed by an energy of ultraviolet light. On the contrary, in the EEPROM, the injection and discharge of the electrons into/from the floating gate are performed by a tunnel current that passes through a tunnel insulating layer having a thickness of about 100 Å. That is, even though the tunnel insulating layer is an insulator, e.g., $SiO_2$, if a high electric field, e.g., higher than 10 MeV/cm, is applied to both ends of the tunnel insulating layer, a Fowler-Nordheim (F-N) current flows. Thus, the injection and discharge of the electrons in the EEPROM is performed using the F-N current.

Primarily, a floating gate tunneling oxide (FLOTOX) type EEPROM cell and a metal nitride oxide semiconductor (MNOS) type EEPROM cell are used in semiconductor devices. The FLOTOX memory cell used as a standard memory cell includes two transistors, i.e., a selection transistor that selects a desired bit line and a memory transistor that stores data as one memory cell. In the memory transistor, a floating gate for storing data by accumulated electric charges and a control gate for controlling the floating gate are formed while interposing a thin interlayer dielectric therebetween.

FIG. 1 illustrates a cross-sectional view of a nonvolatile semiconductor memory device including a conventional FLOTOX memory cell.

Referring to FIG. 1, a selection transistor 5 and a memory transistor 7 are separated from each other by a predetermined distance. More specifically, a first conductive layer 31 formed of a polysilicon, an interlayer dielectric 32, and a second conductive layer 33 formed of a polysilicon are formed as gate patterns 30 of the selection transistor 5 and the memory transistor 7 on an upper portion of a gate oxide layer 12 surrounding a tunnel insulating layer 14 on a surface of a semiconductor substrate 10. A source region 20 of the memory transistor 7 and a bit line junction region 24 of the selection transistor 5 are located in the semiconductor substrate 10. A cell doping region 26, in which n-type impurities are doped in high concentration, is located on a lower portion of the tunnel insulating layer 14 for facilitating performance of the injection and discharge of electrons. A high concentration doping region 26' for reducing a contact resistance may be further formed on a side surface of the cell doping region 26 in a direction of the selection transistor 5.

A width L1 and a thickness of the tunnel insulating layer 14 are very important in a reliability of the EEPROM. In particular, because the width L1 of the tunnel insulating layer 14 is directly related to the integrity of the EEPROM, it is desirable that the width L1 is narrow.

FIG. 2 illustrates a cross-sectional view of an area "a" shown in FIG. 1 for illustrating problems in the conventional EEPROM.

Referring to FIG. 2, a first depletion region 28 is generated on a boundary of the cell doping region 26, when a voltage is applied to the bit line junction region 24. More specifically, both sides and the lower end of the cell doping region 26, and portions contacting the tunnel insulating layer 14 and the gate insulating layer 12 are depleted, as shown by a second depletion region 29. The width of the first depletion region 28 increases as the applied voltage increases. The increase of the width causes a band-to-band tunneling phenomenon by connecting the first and second depletion regions 28 and 29. When the band-to-band tunneling phenomenon occurs, current is leaked in the first and second depletion regions 28 and 29 due to electron-hole pairs.

In FIG. 2, a distance D1 between end portions of the tunnel insulating layer 14 and the cell doping region 26 can be increased so that the first and second depletion regions 28 and 29 do not contact each other, however, as the distance D1 increases, the integrity of the EEPROM is reduced. Therefore, it is desirable that the distance D1 is short. Consequently, the distance D1 and the width L1 of the tunnel insulating layer 14 should be minimized in order to increase the integrity of the EEPROM without allowing contact between the first and second depletion regions 28 and 29.

However, the tunnel insulating layer 14 is generally formed by wet etching a thermal oxide layer (not shown) to expose the substrate 10, and thermally oxidizing the exposed substrate 10. Since the wet etching method is an isotropic etching method, the etching is performed in a direction of the side surface of the substrate, thus the width L1 of the tunnel insulating layer 14 may become larger than the desired pattern size. In addition, the etching time increases and the etching is made along an interface between a photoresist pattern (not shown) and the thermal oxide layer. Accordingly, a profile of the sidewall of the tunnel insulating layer 14 becomes inclined. The inclined profile degrades an efficiency of the EEPROM programming similar to the increase of the width L1 of the tunnel insulating layer 14.

SUMMARY OF THE INVENTION

The present invention is therefore directed to provides a nonvolatile semiconductor memory device and a method of fabricating the same, which substantially overcome one or more of the problems due to the limitations and disadvantages of the related art.

It is a feature of an embodiment of the present invention to provide a nonvolatile semiconductor memory device that can prevent a band-to-band tunneling phenomenon.

It is another feature of an embodiment of the present invention to provide a nonvolatile semiconductor memory device that can prevent a width of a tunnel insulating layer from being increased due to excessive etching.

It is still another feature of an embodiment of the present invention to provide a nonvolatile semiconductor memory device that can prevent a sidewall of the tunnel insulating layer from being inclined.

It is yet another feature of an embodiment of the present invention to provide a method of fabricating the nonvolatile semiconductor memory device.

At least one of the above and other features and advantages of the present invention may be realized by providing a nonvolatile semiconductor memory device includes a cell doping region and source/drain regions in a semiconductor substrate, the cell doping region being doped as a first conductive type, a channel region disposed between the source/drain regions in the semiconductor substrate, a tunnel doping region of the first conductive type formed in a predetermined region of an upper portion of the cell doping region, the tunnel doping region being doped in a higher concentration than that of the cell doping region, a tunnel insulating layer formed on a surface of the semiconductor substrate on the tunnel doping region, a gate insulating layer surrounding the tunnel insulating layer and covering the channel region and the cell doping region exposed beyond the tunnel doping region, and a gate electrode covering the tunnel insulating layer and on the gate insulating layer.

The first conductive material may be an n-type impurity.

A doping concentration of the tunnel doping region may be determined by a distance between end portions of the tunnel insulating layer and the cell doping region.

A width of the tunnel insulating layer may be between about 0.15 to about 0.3 μm and a thickness of the tunnel insulating layer may be between about 70 to about 120 Å.

A sidewall of the tunnel insulating layer may have a vertical profile.

The cell doping region may be doped with an ion selected from the group including arsenic (As) ion and phosphorous (P) ions.

At least one of the above and other features and advantages of the present invention may be realized by providing a method of fabricating a nonvolatile semiconductor memory device, including forming a first thermal oxide layer on a semiconductor substrate, forming a cell doping region of a first conductive type in the semiconductor substrate, forming a tunnel doping region of the first conductive type, the tunnel doping region being doped in a higher concentration than the cell doping region, on a part of an upper portion of the cell doping region, and at the same time, forming a second thermal oxide layer pattern having greater defects than that of the first thermal oxide layer on the tunnel doping region, forming a tunnel insulating layer on the tunnel doping region, and at the same time, forming a gate insulating layer covering the cell doping region exposed beyond the tunnel doping region and a channel region, and forming a gate electrode covering the tunnel insulating layer and on the gate insulating layer.

Forming the cell doping region may include forming a first photoresist pattern defining the cell doping region on the first thermal oxide layer, and injecting ions of a predetermined first conductive material into the semiconductor substrate using the first photoresist pattern as an injection mask.

Forming the cell doping region may include injecting arsenic (As) ions at a dose of as much as about $1 \times 10^{13}/cm^2$ to about $1.5 \times 10^{14}/cm^2$ at an energy of about 80 to about 100 KeV. Alternatively, forming the cell doping region may include injecting phosphorous (P) ions at a dose of as much as about $1 \times 10^{13}/cm^2$ to about $1.5 \times 10^{14}/cm^2$ at an energy of about 50 to about 100 KeV.

Forming the tunnel doping region may include forming a second photoresist pattern defining the tunnel doping region on the first thermal oxide layer and injecting ions of the first conductive material into a predetermined portion of the cell doping region using the second photoresist pattern as an injection mask.

Forming the tunnel doping region may include injecting arsenic (As) ions at a dose of as much as about $1 \times 10^{13}/cm^2$ to about $1 \times 10^{15}/cm^2$ at an energy of about 30 to about 50 KeV. Alternatively, forming the tunnel doping region may include injecting phosphorous (P) ions at a dose of as much as about $1 \times 10^{13}/cm^2$ to about $1 \times 10^{15}/cm^2$ at an energy of about 20 to about 30 KeV.

Forming the tunnel insulating layer may include exposing the semiconductor substrate by removing the second thermal oxide pattern formed on the tunnel doping region using a wet etching method, removing the second photoresist pattern, and thermally oxidizing the resultant structure.

An etch selectivity between the second thermal oxide pattern and the first thermal oxide layer may be about 10:1 to about 50:1.

Removing the second thermal oxide pattern may include using a diluted HF or $NH_4F$, and a buffered oxide etchant that is a mixed solution of HF and deionized water.

The method may further include determining a doping concentration of the tunnel doping region by a distance between end portions of the tunnel insulating layer and the cell doping region.

Forming the tunnel insulating layer may include forming the tunnel insulating layer to have a width between about 0.15 to about 0.3 μm and a thickness between about 70 to about 120 Å.

Forming the tunnel insulating layer may include forming a sidewall of the tunnel insulating layer to have a vertical profile.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
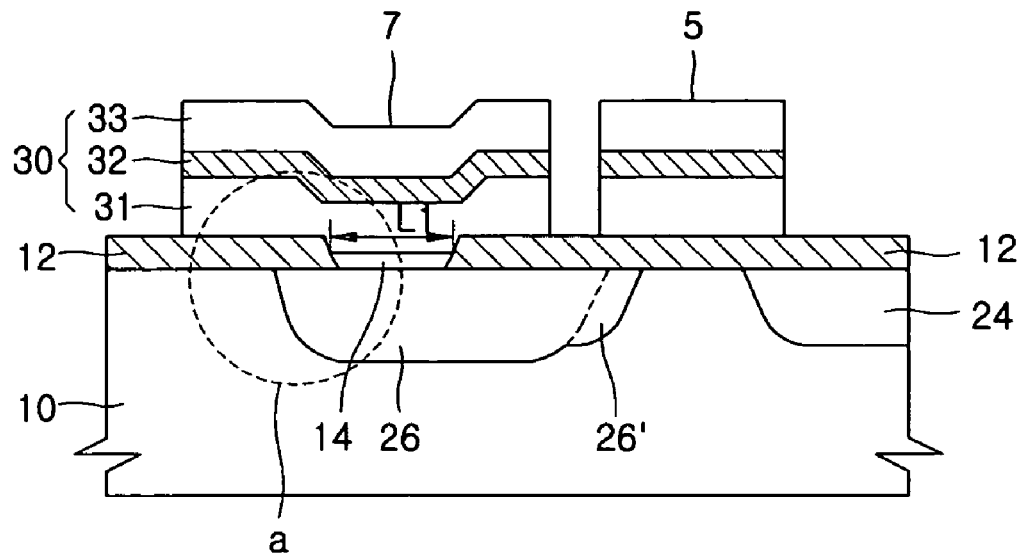
FIG. 1 illustrates a cross-sectional view of a nonvolatile semiconductor memory device including a conventional floating gate tunneling oxide (FLOTOX) type memory device.
Figure 2:
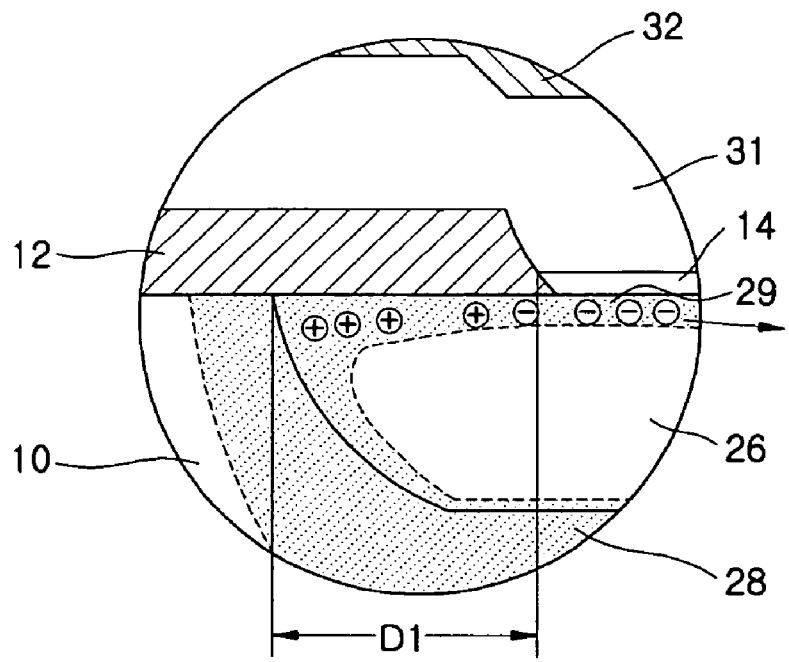
FIG. 2 illustrates a partial cross-sectional view of an area "a" of FIG. 1 for illustrating a problem of a conventional electrically erasable programmable read only memory (EEPROM)

Korean Patent Application No. 2004-54077, filed on Jul. 12, 2004, in the Korean Intellectual Property Office, and entitled: "Nonvolatile Semiconductor Memory Device and Method of Fabricating the Same," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of films, layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 3:
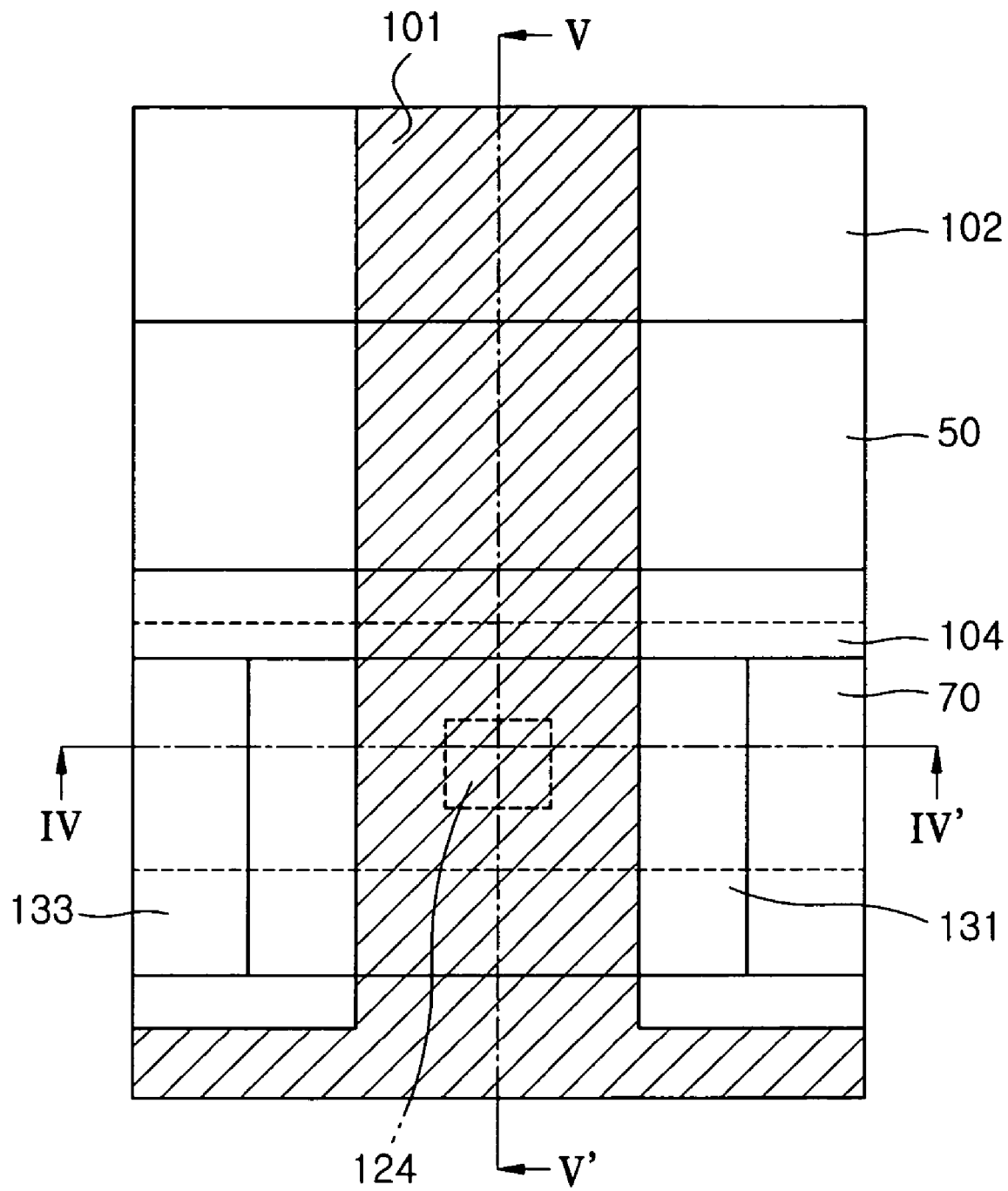
FIG. 3 illustrates a plan view of a lay-out of a FLOTOX type memory cell according to an embodiment of the present invention.
Figure 4:
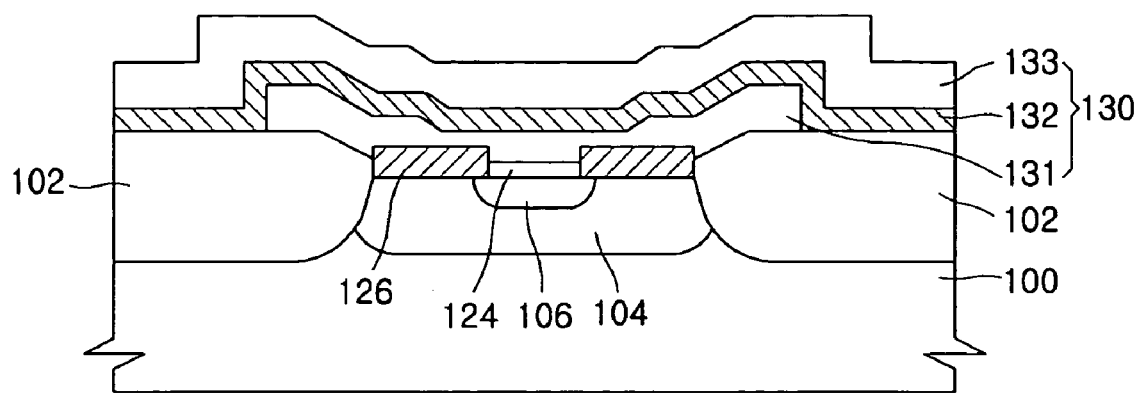
FIG. 4 illustrates a cross-sectional view of the FLOTOX type memory cell shown in FIG. 3 taken along line IV-IV'.
Figure 5:
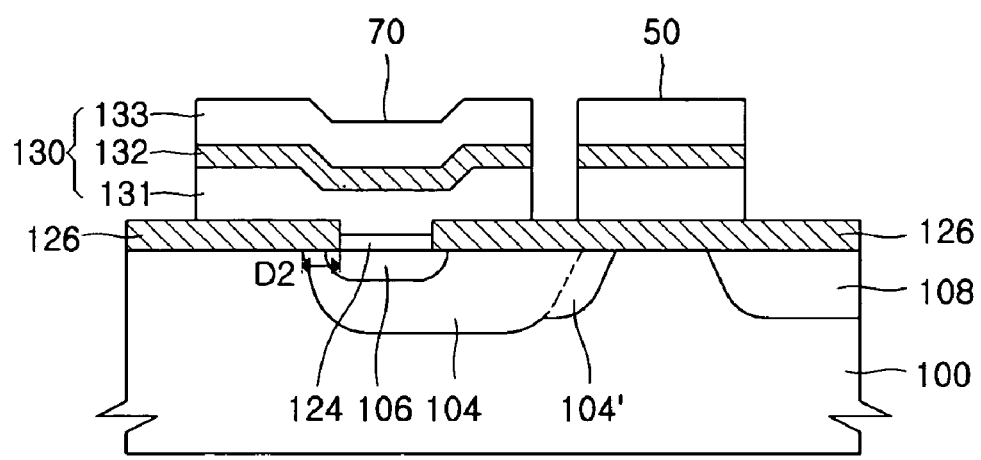
FIG. 5 illustrates a cross-sectional view of the FLOTOX type memory cell shown in FIG. 3 taken along line V-V'.

FIGS. 3 through 5 illustrate views of a non-volatile semiconductor memory device having a floating gate tunneling oxide (FLOTOX) type memory device according to an embodiment of the present invention.

FIG. 3 illustrates a plan view of a lay-out of the FLOTOX type memory cell according to an embodiment of the present invention. On a front surface of a semiconductor substrate, on which an active area 101 and a non-active area 102, e.g., a field oxide layer, are formed, a selection transistor pattern 50 and a memory transistor pattern 70 are separated from each other. Reference numeral 104 indicates a cell doping region, reference numeral 124 indicates a tunnel insulating layer, reference numeral 131 indicates a first conductive layer, i.e., a floating gate, and reference numeral 133 indicates a second conductive layer, i.e., a control gate. In addition, the FLOTOX memory cell shown in FIG. 3 will be described in greater detail with reference to cross-sectional views taken in two directions.

FIG. 4 illustrates a cross-sectional view of the FLOTOX type memory cell shown in FIG. 3 taken along line IV-IV'. The field oxide layer 102 that is formed by performing an isolation process is formed on a semiconductor substrate 100. The cell doping region 104 is formed on a lower portion of the active area between the field oxide layer 102 by injection of ions. A tunnel doping region 106 of a first conductive type that is doped in a higher concentration than that of the cell doping region 104 is formed on a predetermined region of an upper portion of the cell doping region 104. The cell doping region 104 is a region where impurity ions are implanted for facilitating F-N tunneling. The tunnel insulating layer 124 is surrounded by a gate insulating layer 126 on the tunnel doping region 104. The tunnel insulating layer 124 is thinner than the gate insulating layer 126, and becomes a moving path of electric charges during programming and erasing operations. The first conductive layer 131, i.e., the floating gate, the interlayer dielectric 132, and the second conductive layer 133, i.e., the control gate, are stacked sequentially on the tunnel insulating layer 124 to form gate pattern 130.

FIG. 5 illustrates a cross-sectional view of the FLOTOX type memory cell shown in FIG. 3 taken along line V-V'. Referring to FIG. 5, the selection transistor pattern 50, i.e., the selection transistor, and the memory transistor pattern 70, i.e., the memory transistor, are separately formed with a predetermined interval therebetween. More specifically, the first conductive layer 131, which may be formed of a polysilicon, the interlayer dielectric 132, and the second conductive layer 133, which may be formed of a polysilicon, are formed as the gate patterns 130 of the selection transistor 50 and the memory transistor 70 on the gate insulating layer 126 surrounding the tunnel insulating layer 124 on the substrate 100. A source region 108 of the memory transistor 70 and a drain region, which is a bit line junction region, 110 of the selection transistor 50 are formed in the semiconductor substrate 100. The cell doping region 104, in which n-type impurities are doped in a high concentration, is formed on a lower portion of the tunnel insulating layer 124. A high concentration doping region 104' for reducing a contact resistance may be further formed on a side surface of the cell doping region 104 in a direction of the selection transistor 50. The tunnel doping region 106 is formed on the cell doping region 104 as shown in FIG. 4.

In the present invention, a doping concentration of the tunnel doping region 106 may be determined by a distance D2 between end portions of the tunnel insulating layer 124 and the cell doping region 104. More specifically, when the doping concentration of the tunnel doping region 106 is increased, a width of a depletion region is reduced, even if a high voltage is applied to a bit line junction region 110. When a width of the depletion region around the tunnel insulating layer 124 is reduced, there is a low possibility that the depletion region around the tunneling insulating layer 124 will contact the depletion region generated on a boundary of the cell doping region 104. Therefore, the distance D2 between the end portions of the tunnel insulating layer 124 and the cell doping region 104 may be reduced in the design of the memory device. Accordingly, the EEPROM device can be highly integrated. Here, there may be a method of doping the cell doping region 104 in a high concentration in order to reduce the depletion region, however, in this case, a leakage current may be excessively increased. That is, when the cell doping region 104 is doped in the high concentration like the tunnel doping region 106, a breakdown voltage is lowered, and a reliability of the device is greatly degraded.

Additionally, a sidewall of the gate insulating layer 126, which contacts the tunnel insulating layer 124, may have a vertical profile. This characteristic is caused by the embodiment of the present invention, and will be described in greater detail with reference to FIGS. 6 through 9.

FIGS. 6 through 9 illustrate cross-sectional views of stages in a method of fabricating a tunnel insulating layer for inclusion in the nonvolatile semiconductor memory device according to an embodiment of the present invention. The method of fabricating the tunnel insulating layer will be described with reference to cross-sectional views of the memory cell taken along line V-V' of FIG. 3.

Figure 6:
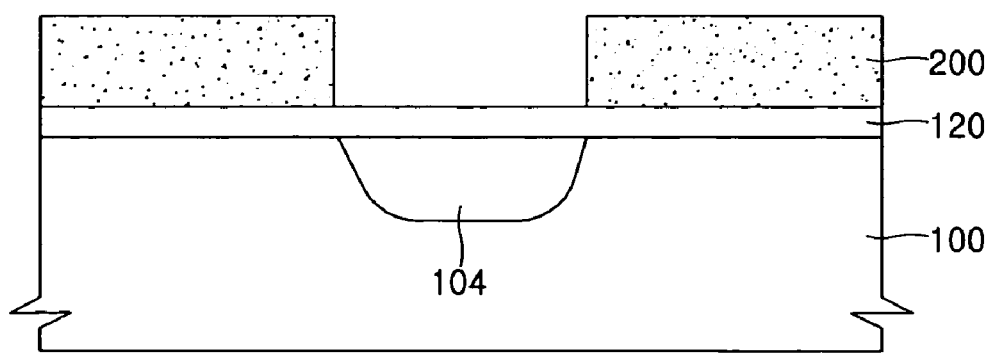
FIGS. 6 through 9 illustrate cross-sectional views of stages in a method of fabricating a tunnel insulating layer for inclusion in a nonvolatile semiconductor memory device according to an embodiment of the present invention.

Referring to FIG. 6, a first thermal oxide layer 120 is formed on the substrate 100 by a thermal oxidation method to a thickness of about 250 to about 300 Å. In addition, the cell doping region 104 is formed on a predetermined portion on the semiconductor substrate 100 under the first thermal oxide layer 120. For forming the cell doping region 104, a first photoresist pattern 200 is applied on the first thermal oxide layer 120. Then, a first conductive material is implanted into the semiconductor substrate 100 as ions using the first photoresist pattern 200 as an injection mask. For example, the cell doping region 104 can be formed by ion-injecting arsenic (As) at a dose of as much as about $1 \times 10^{13}/cm^2$ to about $1.5 \times 10^{14}/cm^2$ at an energy of about 80 to about 100 KeV, or by ion-injecting phosphorous (P) at a dose of as much as about $1 \times 10^{13}/cm^2$ to about $1.5 \times 10^{14}/cm^2$ at an energy of about 50 to about 100 KeV.

Figure 7:
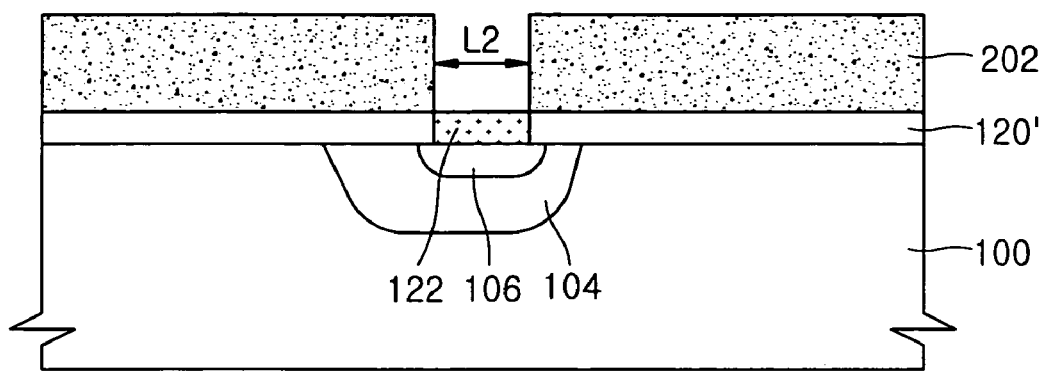

Referring to FIG. 7, the tunnel doping region 106 of the first conductive type is formed on the upper portion of the cell doping region 104 at a higher concentration than that of the cell doping region 104. At the same time, a second thermal oxide pattern 122 including more defects, e.g., vacancies and pores, than the first thermal oxide pattern 120' is formed on the tunnel doping region 106.

For forming the tunnel doping region 106, the first photoresist pattern 200 is removed, e.g., in a general way, and a second photoresist pattern 202 having an opening of width L2 for defining the tunnel doping region 106 is formed on the first thermal oxide layer 120. In addition, the first conductive material is implanted into the semiconductor substrate 100 using the second photoresist pattern 202 as an injection mask. For example, the tunnel doping region 106 may be formed by ion-injecting As at a dose of as much as about $1 \times 10^{13}/cm^2$ to about $1 \times 10^{15}/cm^2$ at an energy of about 30 to about 50 KeV, or by ion-injecting P at a dose of as much as about $1\times10^{13}/cm^2$ to about $1\times10^{15}/cm^2$ at an energy of about 20 to about 30 KeV.

Figure 8:
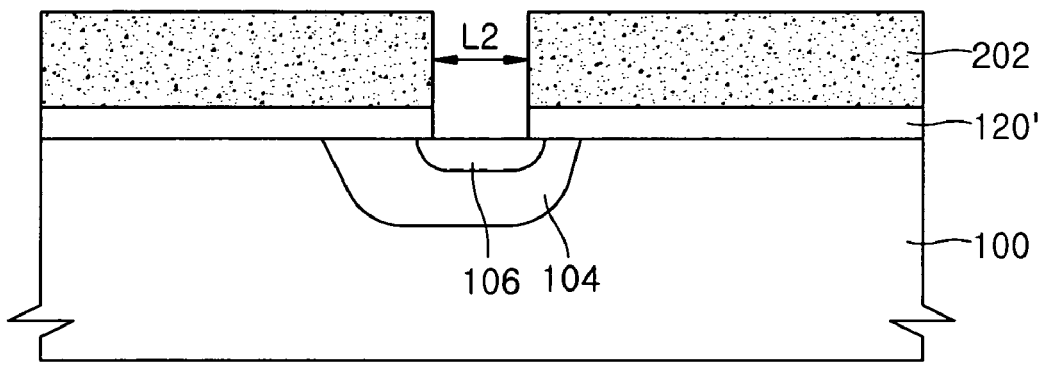

Referring to FIG. 8, the second thermal oxide pattern 122 that is formed on the tunnel doping region 106 is removed by a wet etching method to expose the semiconductor substrate 100. Here, the second thermal oxide pattern 122 is removed by using diluted HF or $NH_4F$, and buffered oxide etchant (BOE) that is a mixed solution of HF and deionized water. Here, the second thermal oxide pattern 122 has an etch selectivity of about 50:1 to about 10:1 with respect to the first thermal oxide pattern 120, because the second thermal oxide pattern 122, which was internally damaged by impurity ions of high concentration in a process of forming the tunnel doping region, is weak for the liquid etchant. Accordingly, the time required to remove the second thermal oxide pattern 122 can be reduced, thus preventing the first thermal oxide pattern 120' from being etched in a direction of the sidewall of the tunnel insulating layer 124.

In addition, since the etching rate is fast, a phenomenon that the first thermal oxide pattern 120' is etched along a lower surface of the second photoresist pattern 202, i.e., an undercut phenomenon, may be prevented. If the undercut phenomenon occurs, the sidewall of the tunnel insulating layer 124 has an inclined profile. However, in this embodiment of the present invention, the undercut phenomenon does not occur and the sidewall of the tunnel insulating layer 124 may have a vertical profile. Advantageously, the vertical profile can increase a coupling ratio when the nonvolatile memory device is charged or erased. More specifically, the vertical profile reduces a capacitance of the tunnel insulating layer 124.

A desired portion of the nonvolatile memory device can be exactly removed by the wet etching method. Therefore, the width L2 of the opening of the tunnel insulating layer 124 can be exactly matched with the width of the photoresist pattern 200. More specifically, since etching in the sidewall direction is prevented, the width L2 of the tunnel insulating layer 124 may be minimized. Accordingly, an overlap margin can be increased more than that of the conventional nonvolatile memory device. It is desirable that the width L2 of the tunnel insulating layer 124 is about 0.15 to about 3.0 µm, and more desirably, about 0.2 to about 0.25 µm.

Figure 9:
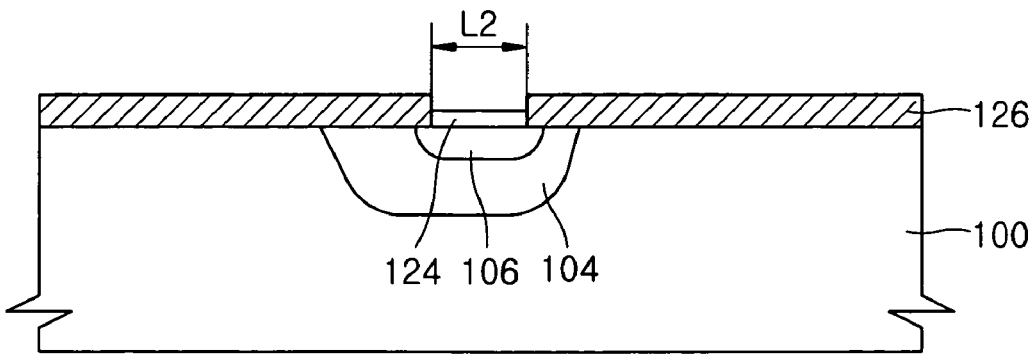

Referring to FIG. 9, the tunnel insulating layer 124 is formed on the tunnel doping region 106, and at the same time, the gate insulating layer 126 that covers the cell doping region 104 beyond the tunnel doping region 106 and a channel region, between the source region 108 and the drain region 110, is formed. The tunnel insulating layer 124 is formed by removing the second photoresist pattern 202, and then by thermally oxidizing the front surface of the resultant structure to have a thickness of between about 70 to about 120 Å.

According to the nonvolatile semiconductor memory device and the method of fabricating the memory device of an embodiment of the present invention, the depletion region may be minimized by doping impurities of a high concentration in the semiconductor substrate under the tunnel insulating layer.

In addition, since the thermal oxide layer, which is damaged by the ion injection, is etched, the etching rate can be increased, and accordingly, the width of the tunnel insulating layer can be minimized and the overlap margin can be increased.

Moreover, since the sidewall of the tunnel insulating layer may have a vertical profile due to the fast etching rate, the coupling ratio can be increased in charging or erasing the memory device.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A nonvolatile semiconductor memory device, comprising:
    a cell doping region and source/drain regions in a semiconductor substrate, the cell doping region being doped as a first conductive type;
    a channel region disposed between the source/drain regions in the semiconductor substrate;
    a tunnel doping region of the first conductive type formed in a predetermined region of an upper portion of the cell doping region, the tunnel doping region being doped in a higher concentration than that of the cell doping region, a width of the tunnel doping region being smaller than a width of the cell doping region;
    a tunnel insulating layer formed on a surface of the semiconductor substrate on the tunnel doping region, a width of the tunnel insulating layer being smaller than the width of the tunnel doping region;
    a gate insulating layer surrounding the tunnel insulating layer and covering the channel region and the cell doping region exposed beyond the tunnel doping region; and
    a gate electrode covering the tunnel insulating layer and on the gate insulating layer.

2. The memory device as claimed in claim 1, wherein the first conductive material is an n-type impurity.

3. The memory device as claimed in claim 1, wherein a doping concentration of the tunnel doping region depends at least in part on a distance between end portions of the tunnel insulating layer and the cell doping region.

4. The memory device as claimed in claim 1, wherein the width of the tunnel insulating layer is between about 0.15 to about 0.3 µm and a thickness of the tunnel insulating layer is between about 70 to about 120 Å.

5. The memory device as claimed in claim 1, wherein a sidewall of the tunnel insulating layer has a vertical profile.

6. The memory device as claimed in claim 1, wherein the cell doping region is doped with an ion selected from the group consisting of arsenic (As) ion and phosphorous (P) ions.

7. The memory device as claimed in claim 1, further comprising a selection transistor in the semiconductor substrate.

8. The memory device as claimed in claim 7, wherein the high concentration doping region is formed at least partially under the selection transistor.

9. The memory device as claimed in claim 1, wherein the width of the tunnel doping region and the width of the cell doping region are measured in a channel length direction of the channel region.

10. The memory device as claimed in claim 1, wherein the cell doping region completely surrounds the tunnel doping region.

* * * * *